United States Patent
Misra

(10) Patent No.: US 10,184,192 B2
(45) Date of Patent: Jan. 22, 2019

(54) APPARATUS FOR GROWING DIAMONDS BY MICROWAVE PLASMA CHEMICAL VAPOUR DEPOSITION PROCESS AND SUBSTRATE STAGE USED THEREIN

(71) Applicant: IIa Technologies Pte. Ltd., Singapore (SG)

(72) Inventor: Devi Shanker Misra, Singapore (SG)

(73) Assignee: SUNSET PEAK INTERNATIONAL LIMITED, Singapore (SG)

( * ) Notice: Subject to any disclaimer, the term of this patent is extended or adjusted under 35 U.S.C. 154(b) by 218 days.

(21) Appl. No.: 14/391,959

(22) PCT Filed: Apr. 12, 2013

(86) PCT No.: PCT/SG2013/000144
§ 371 (c)(1),
(2) Date: Oct. 10, 2014

(87) PCT Pub. No.: WO2013/154504
PCT Pub. Date: Oct. 17, 2013

(65) Prior Publication Data
US 2015/0059647 A1    Mar. 5, 2015

Related U.S. Application Data

(63) Continuation of application No. 13/445,070, filed on Apr. 12, 2012, now abandoned.

(51) Int. Cl.
*C23C 16/00* (2006.01)
*C23F 1/00* (2006.01)
(Continued)

(52) U.S. Cl.
CPC .......... *C30B 25/105* (2013.01); *C23C 16/27* (2013.01); *C23C 16/4402* (2013.01);
(Continued)

(58) Field of Classification Search
CPC ....... C30B 25/105; C30B 25/12; C30B 25/14; C30B 25/20; C30B 29/04; C30B 25/025;
(Continued)

(56) References Cited

U.S. PATENT DOCUMENTS 4,466,380 A    8/1984  Jansen et al.
4,523,544 A *  6/1985  Harada .............. C23C 16/507
                                                    118/50.1
(Continued)

FOREIGN PATENT DOCUMENTS

EP    0528778    2/1993
EP    0709486    5/1996
(Continued)

OTHER PUBLICATIONS

International Search Report dated Jun. 27, 2014 for PCT/SG2013/000144.

*Primary Examiner* — Rakesh K Dhingra
(74) *Attorney, Agent, or Firm* — Kang S. Lim

(57) ABSTRACT

An apparatus for growing diamonds, the apparatus comprising: one or more chambers, each chamber is in fluid connection with one or more other chambers, each chamber comprising one or more substrate stage assembly within the chamber to support a substrate stage having a plurality of diamond seeds disposed thereon.

13 Claims, 6 Drawing Sheets

(51) Int. Cl.

| | |
|---|---|
| *H01L 21/306* | (2006.01) |
| *C30B 25/10* | (2006.01) |
| *C23C 16/27* | (2006.01) |
| *C23C 16/44* | (2006.01) |
| *C23C 16/458* | (2006.01) |
| *C23C 16/54* | (2006.01) |
| *H01J 37/32* | (2006.01) |
| *C30B 25/02* | (2006.01) |
| *C30B 29/04* | (2006.01) |
| *C30B 25/12* | (2006.01) |
| *C30B 25/14* | (2006.01) |
| *C30B 25/20* | (2006.01) |

(52) U.S. Cl.
CPC ........ *C23C 16/4585* (2013.01); *C23C 16/54* (2013.01); *C30B 25/025* (2013.01); *C30B 25/12* (2013.01); *C30B 25/14* (2013.01); *C30B 25/20* (2013.01); *C30B 29/04* (2013.01); *H01J 37/3244* (2013.01); *H01J 37/32192* (2013.01); *H01J 37/32724* (2013.01); *H01J 37/32899* (2013.01)

(58) Field of Classification Search
CPC ........... H01J 37/32899; H01J 37/32192; H01J 37/3244; H01J 37/32724; C23C 16/27; C23C 16/54; C23C 16/4402; C23C 16/4585
USPC ................. 118/728–730; 156/345.51–345.55
See application file for complete search history.

(56) References Cited

U.S. PATENT DOCUMENTS

| | | | |
|---|---|---|---|
| 5,087,478 A | 2/1992 | Williamson | |
| 5,174,881 A * | 12/1992 | Iwasaki | C23C 14/022 118/715 |
| 7,024,105 B2 * | 4/2006 | Fodor | C23C 16/4585 118/50.1 |
| 2004/0187790 A1 * | 9/2004 | Bader | C23C 16/4581 118/728 |
| 2006/0102285 A1 * | 5/2006 | Bluck | H01L 21/67161 156/345.32 |
| 2007/0256934 A1 * | 11/2007 | Perata | C03C 17/002 204/298.23 |
| 2008/0190356 A1 * | 8/2008 | Bhandari | C30B 25/105 117/98 |
| 2009/0280268 A1 * | 11/2009 | Glukhoy | C23C 16/045 427/578 |
| 2010/0068870 A1 * | 3/2010 | Ovshinsky | C23C 16/452 438/485 |
| 2012/0058630 A1 * | 3/2012 | Quinn | C23C 16/54 438/483 |
| 2012/0160419 A1 * | 6/2012 | Lee | C23C 14/541 156/345.52 |
| 2014/0220261 A1 * | 8/2014 | Asmussen | C23C 16/511 427/570 |

FOREIGN PATENT DOCUMENTS

| | | | |
|---|---|---|---|
| JP | 57-64922 | * | 4/1982 |
| JP | H02-137796 | | 5/1990 |
| WO | WO2010140766 | * | 12/2010 |

* cited by examiner

APPARATUS FOR GROWING DIAMONDS BY MICROWAVE PLASMA CHEMICAL VAPOUR DEPOSITION PROCESS AND SUBSTRATE STAGE USED THEREIN

CROSS REFERENCE TO RELATED APPLICATION

This application is the National Phase application of International Application No. PCT/SG2013/000144, filed Apr. 12, 2013, which designated the United States and published in English, which further claims the benefit of priority from U.S. patent application Ser. No. 13/445,070, filed Apr. 12, 2012. The foregoing related applications, in their entirety, are incorporated herein by reference.

FIELD OF THE INVENTION

The invention relates to growing mono-crystalline diamonds as well as graphitic and non-graphitic inclusion-free diamonds in an apparatus capable of operating microwave plasma chemical vapour deposition. Furthermore, the invention also relates to growing white colour diamonds by using a substrate stage assembly that controls the ratio of gaseous methane molecules and excited methyl ions/radicals in the gas phase in the plasma.

BACKGROUND

Artificial single crystal diamonds have potential for a variety of scientific, industrial and commercial applications, for instance, in jewelery, heat sinks, electronic devices, laser window, optical window, particle detectors and quantum computing devices. As the commercial demand for single crystal diamond increase over the years, it is essential to increase the production of high quality optical and scientific grade single crystal diamonds without compromising the quality of the single crystal diamond. Factually, the requirement of quality is very stringent on the single crystals for applications in scientific products especially for the purpose of semi-conducting devices and the particle detectors. The defects, inclusions, microscopic grain boundaries, other orientations are some prominent defects in single crystal diamonds and have to be deeply characterized in details.

The prior art so far has used one deposition chamber in which the suitable gases such as methane, hydrogen and other gases such as nitrogen, oxygen and diborane are supplied therein to grow single crystal diamonds, with the exhaust gases exiting to the atmosphere. The gases are decomposed into various ionic forms and radicals using an intense microwave electric field at a frequency of 2.45 GHz. The impurities often get incorporated in to the diamond structure from the gas lines, chambers and other sources of contaminations. A significant point to be noted, however, is that the efficiency of the decomposition of the gases in their ionic form is substantially low and it is perhaps not realized that the exhaust still may contain the constituent gases for further diamond growth. Moreover the gas composition is also purified after passing through the plasma phase as most impurities would have been removed by the plasma. It is the endeavour to understand this and utilize this fundamental fact to which the present invention is directed.

A process of growing the poly-crystalline grains of diamond was disclosed in U.S. Pat. No. 3,030,187. Since then, various chemical vapour deposition (CVD) techniques have been devised to produce poly-crystalline and mono-crystalline diamonds whereby methane and hydrogen is used as precursor gases. The role of methane is to ensure the supply of carbon in the gas phase while the hydrogen plays an important role in the stabilization of diamond phase.

Poly-crystalline diamond, despite having similar properties as mono-crystalline diamonds, is not a recommended material for new industrial applications due to the presence of grain boundaries and defects contained therein. In addition, the thermal conductivity of a poly-crystalline diamond is inferior to that of a mono crystalline diamond. Furthermore, the grain boundaries in poly crystalline diamonds play a deteriorating role and inhibits the exhibition of the superior properties unique to natural diamonds because the grain boundaries act as scattering centres. The presence of the grain boundaries in poly-crystalline diamonds are a major drawback in industrial applications.

Accordingly, there is a clear preference for using mono-crystalline diamonds in industrial applications. However, it is difficult to grow mono-crystalline diamonds with the same texture, clarity, purity and finish as those of a natural diamond. Although mono-crystalline diamond has superior properties compared to poly-crystalline diamond, microscopic and macroscopic graphitic and non-graphitic inclusions, feathers (long line defects) are very common in CVD grown mono-crystalline diamond.

Detailed characterization of defects in CVD grown mono-crystalline diamond can be performed by Raman spectroscopy and X-ray diffraction (XRD) which reveals the defects comprising of graphitic regions having a size in the range of submicrons to several microns contained therein.

The existence of the graphitic and non-graphitic inclusions in the mono-crystalline chemical vapour deposited diamond (CVD diamond) may be due to the presence of un-reacted methane in the deposition chamber. Almost all techniques employ a mixture of methane and hydrogen gases for the CVD of diamond. The methane gas is electrically decomposed leading to the formation of excited methyl group species ($CH_3^+$ ions) due to the electric field of microwaves of 2.45 GHz frequency. The electrical discharge of the methane and hydrogen gases form a hot plasma consisting of $CH_3^+$ ions, atomic hydrogen, $H_2^+$ ions and a significant concentration of electrons. The plasma region of the prior art is of substantially ellipsoid shape and it engulfs the substrate stage assembly completely.

Prior art substrate stages are generally made of molybdenum in the shape of a flat disc which is used as a pedestal for loading the diamond seeds (substrates) of the sizes varying from 1 mm×1 mm to 10 mm×10 mm and having a thickness of 1 mm to 3 mm as the case may be. The pedestal can also be made of tungsten or any other suitable metal. As the methyl ions reach substrate at a temperature 900° C., their mobility is high and they start forming a sp3 bonded diamond network in presence of high concentration of hydrogen. The boundary (outer periphery) of the plasma region may contain the neutral molecular methane gas and it may decompose thermally. The thermal decomposition of the methane occurs at 800° C. and the result of the thermal decomposition is the formation of black carbon soot that can induce the graphitic and non-graphitic impurities in the diamond deposit.

It is an objective of the present invention to provide a substrate stage which provides uniformity of microwave electric field and increase the concentration of $CH3^+$ ions in the plasma region and reduces the ratio of un-reacted methane in the plasma region. The substrate stage also ensures that the heat current flows in such a way so that the temperature of the periphery of the stage is much lower than the rest of the pedestal. As a result, the carbon soot formation can be entirely avoided.

SUMMARY OF THE INVENTION

In accordance with an aspect of the present invention, there is provided an apparatus for growing diamonds, the apparatus comprising: one or more chambers, each chamber is in fluid connection with one or more other chambers, each chamber comprising one or more substrate stage assembly within the chamber to support a substrate stage having a plurality of diamond seeds disposed thereon.

BRIEF DESCRIPTION OF DRAWINGS

This then generally describes the invention but to assist with understanding reference will now be made to the accompanying drawings which show preferred embodiments of the invention.

In the Drawings.

DETAILED DESCRIPTION

Figure 1:
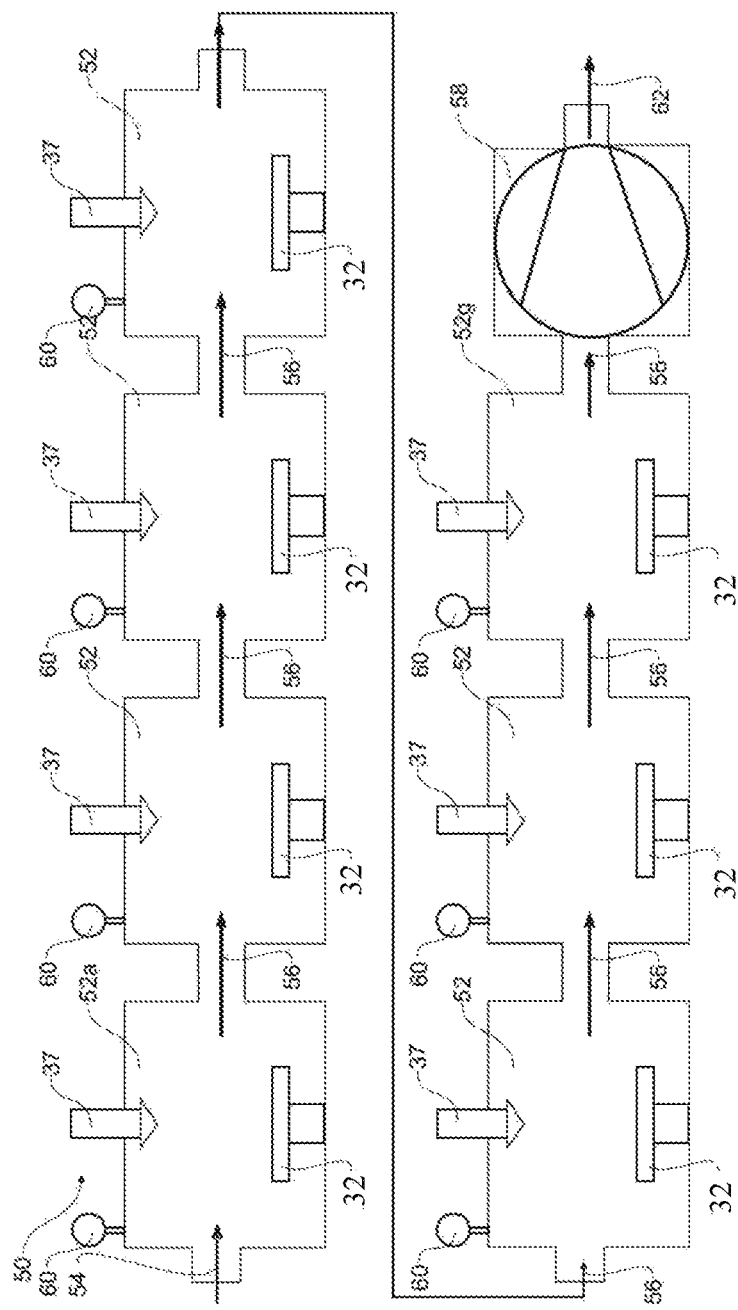
FIG. 1 shows a schematic view of an apparatus for growing gem grade diamonds according to the first embodiment of the invention.
Figure 2:
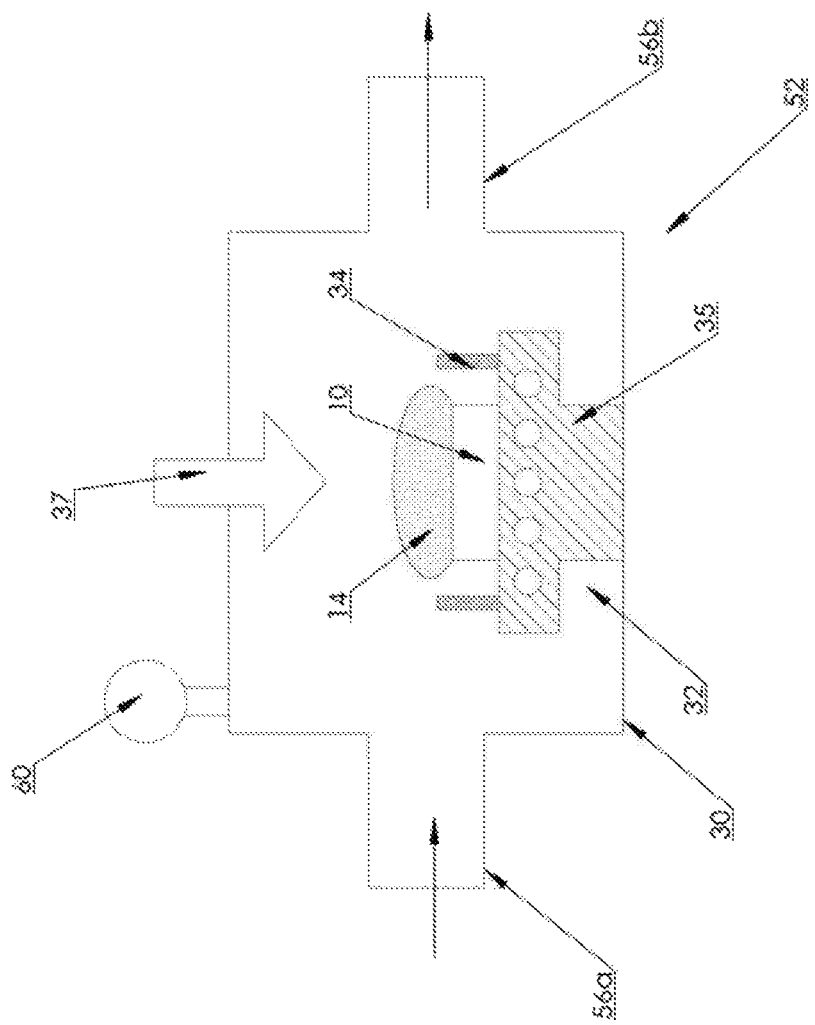
FIG. 2 shows a schematic view of one chamber of the apparatus as shown in FIG. 1 according to the first embodiment of the invention.

FIG. 1 shows a schematic view of an apparatus for the growing gem grade diamonds according to the first embodiment of the present invention and FIG. 2 shows a more detailed view of part of the apparatus of FIG. 1 according to the first embodiment of the present invention.

According to an aspect of the present invention, the apparatus comprises of one or more chambers, each chamber is in fluid connection with one or more other chambers. In a first embodiment of the present invention as shown in FIG. 1, the apparatus 50 comprises a series of chambers 52 arranged in series with gas flow pipes 56 between each chamber. A gas supply supplies gases into a first chamber 52a through a gas entry 54. A vacuum pump 58 arranged after the final chamber 52g evacuates all the chambers and draws through the series of chambers process gases, as discussed below, from the gas entry 54 into the first chamber 52a.

According to an aspect of the present invention, each chamber 52 has one or more substrate stage assembly 32 and a microwave arrangement 37.

In accordance with a first embodiment of the present invention as shown in FIG. 1, during application, the gases supplied are used in sequence with the gas exiting the first chamber becoming the input for second chamber. The vacuum in all the chambers is created by the same vacuum pump 58. Used gas is exhausted at gas exit 62. Each chamber has its own independent pressure measuring means 60 adapted to measure pressure within the chamber. As the purity of the gas improves significantly as it passes through each chamber, the quality of the diamond improves significantly and leads to defect free creation of diamond single crystals. By this invention that it is possible to connect a number of chambers in this way. The measuring means (not shown) may be secured on the chamber and adapted to measure gas quality ratio within the chamber. It is submitted that the number of chambers would reach a maximum number once the gas quality ratio in the last chamber reaches a certain level. Thus, excess number of chambers can be avoided if the maximum number of chambers can be determined.

The gas composition can be formulated in such a way that the diamonds are grown in each chamber with similar growth rate and by conserving the cost, a larger quantity of diamonds can be grown at a higher yield.

It is submitted that a reduction in high quality diamond manufacturing cost and a reduction in the amount of the exhaust gas emission are made possible by reusing the gases supplied to the chambers in aforementioned manner. As long as the number of chambers does not exceed the maximum number, which is determined by the measuring means, the gases can be re-used. The gases can be re-used by been channelled from a chamber to one or more preceding chambers.

FIG. 2 shows one chamber for the production of inclusion-free gem grade diamond in accordance with a first embodiment of the present invention.

In the first embodiment of the present invention, the chamber 52 has a casing 30 adapted for housing a substrate stage assembly 32 therein. In other embodiments, the chamber may comprise of 2 or more substrate stage assemblies. The substrate stage assembly 32 comprises a substrate stage 10 as discussed below in more detail and a peripheral reflector 34. The peripheral reflector 34 comprises a cylindrical body around the substrate stage 10 and is spaced laterally from the peripheral raised edge 13 of the substrate stage 10. The peripheral reflector 34 that can function as a heat shield is used on the outside of the substrate stage 10 so that the substrate stage 10 can reach the required temperature for an appropriate value of power to the chamber. The substrate stage 10 and peripheral reflector 34 are supported on metal plate 35 that is cooled by a fluid coolant such as water, liquid nitrogen, etc. The plate 35 is made of a metal with high thermal conductivity, such as copper, molybdenum and etc.

The peripheral reflector 34 is used mainly to contain the heat and has minor role of containing the microwave electric fields. Its construction is a very thin circular annular ring made of molybdenum with a shiny inside surface for the heat containment. It is kept about 2.5 mm away from the substrate stage 10. As the heat containment is effective, the substrate temperature can be reached at a lower microwave power and improve the power profile of the machine.

The microwave arrangement 37 for supplying microwave power to the chamber 52 generates a 2.45 GHz microwave and directs the microwave energy into the chamber 52 in the region of the substrate stage 10 to form an oblate spheroidal plasma region 14. Gases as discussed below are added into the chamber 52 to form the diamonds. Gas is provided from a gas supply or a previous chamber in the series of chambers via port 56a and is extracted from the chamber to a subsequent chamber via port 56b.

Figure 3:
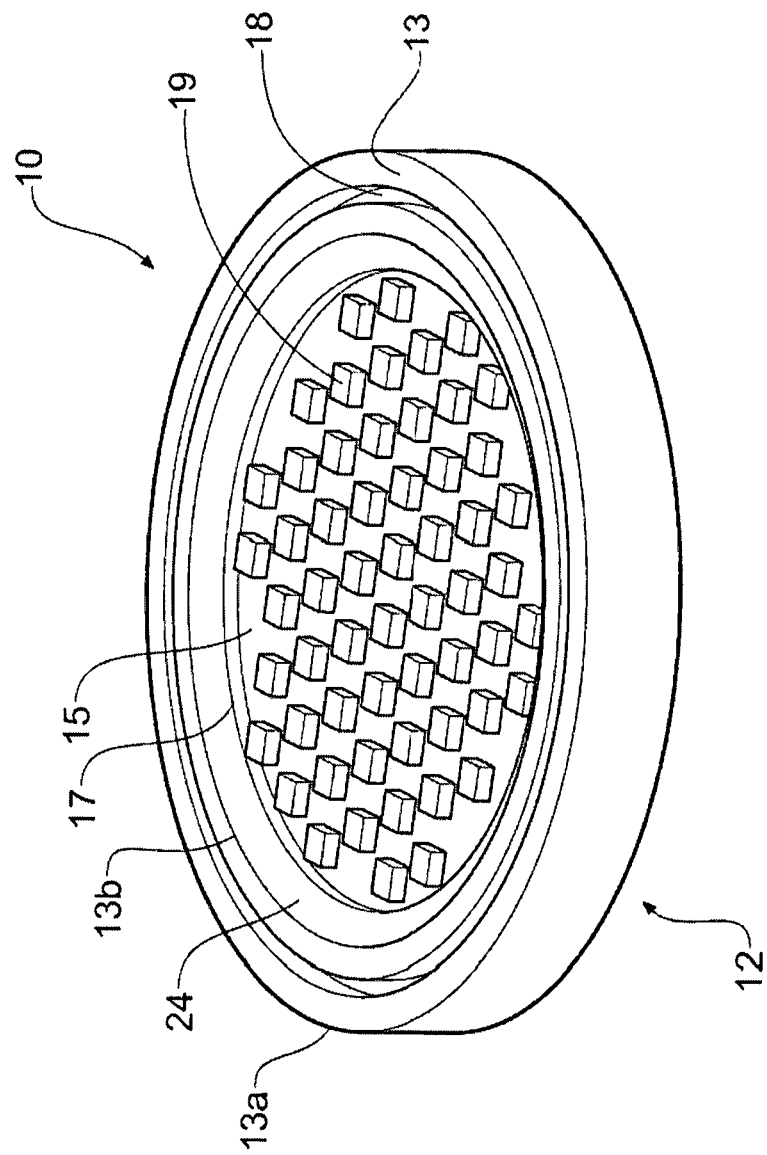
FIG. 3 shows a substrate stage to be used in a chamber according to the first embodiment of the present invention.
Figure 4:
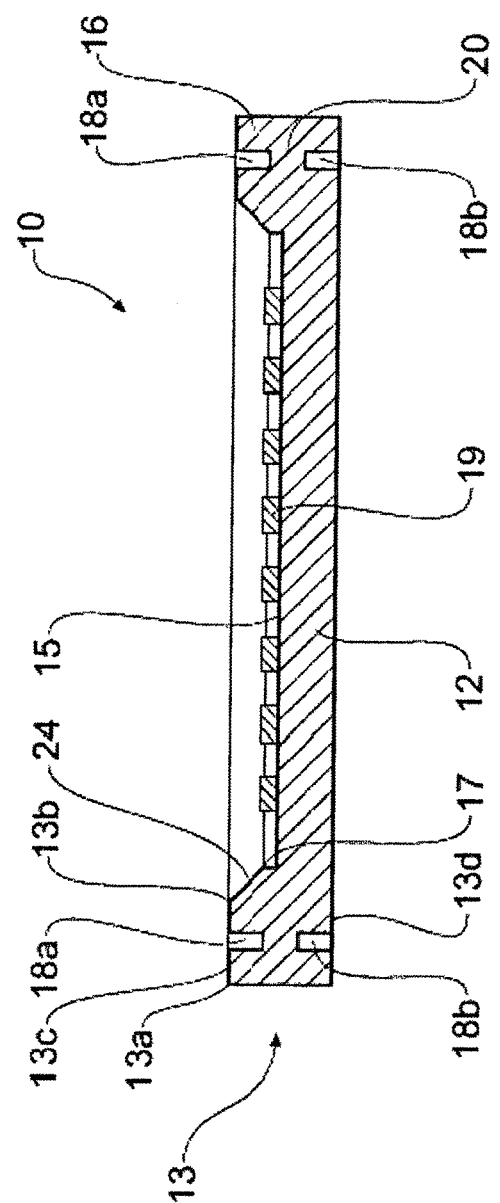
FIG. 4 shows a cross sectional view of the substrate stage of FIG. 3 according to the first embodiment of the invention.

A first embodiment of a substrate stage for use within the series of chambers according to the present invention is shown in FIGS. 3 and 4.

The new substrate stage 10 and substrate stage assembly 32 for controlling the temperature of the different sectors of the substrate stage is designed such that the thermal decomposition of the methane gas is controlled in the vicinity of the substrates and the electric filed is uniform in the whole region of the location of the substrates.

It is submitted that the periphery of the substrate stage 10 is at much lower temperature than that of the bulk of the substrate stage 10 and therefore the formation of the carbon soot is significantly reduced.

The substrate stage 10 has a substantially circular planar base 12 and a peripheral raised edge 13 to the base 12. The peripheral raised edge 13 defines a central recessed substrate receiving surface 15. The central recessed substrate receiving surface 15 is substantially planar. The peripheral raised edge 13 comprises an outer edge 13a and an inner edge 13b and the inner edge 13b comprises a bevel 24 extending down to the recessed substrate receiving surface 15.

In use diamond seeds 19 that may vary in size between 1 mm×1 mm and 10 mm×10 mm and having a thickness ranging from 1 mm to 3 mm are placed in an array or matrix onto the central recessed substrate receiving surface 15 as discussed in more detail as follows.

The peripheral raised edge 13 to the base comprises an upper surface 13c and a lower surface 13d. In a first embodiment of this invention, the peripheral raised edge 13 comprises an annular groove 18a, 18b in at least one of the upper and lower surfaces 13c and 13d respectively. In another embodiment of present invention, there are annular grooves 18a and 18b in both the upper and lower surfaces 13c and 13d respectively.

Multiple diamond seeds are loaded in a recessed region 21 on the central recessed substrate receiving surface 15. The uniform size of the diamond seeds ranging from 1 mm×1 mm and 10×10 mm and having a thickness ranging from 1 mm to 3 mm are placed in a matrix layout. As the microwave power is coupled into the chamber in the presence of hydrogen gas, a plasma region 14 (see FIG. 2) is formed and the entire holder region is heated to a temperature 900° C. to 1200° C. At the periphery of the recessed region 21 the tapered or bevelled surface 24 assists in managing the shape of the plasma region 14. Specifically, the bevel 24 defines an upper sharp edge, which is the inner edge 13b, and a lower sharp edge 17, as shown in FIG. 3. It is submitted that the upper sharp edge and the lower sharp edge together assist in defining and maintaining the desired shape and properties of the plasma region 14.

In accordance to a first embodiment of the present invention, the substrate stage 10 is made of molybdenum. Molybdenum has a high thermal conductivity which assists maintaining an even temperature on the base 12.

The outer periphery 16 of the substrate stage 10 is isolated from the main bulk of the assembly by the annular or slotted grooves 18 which are preferably on both the top and bottom surfaces of the substrate stage 10. Heat conduction to the outer periphery is region is less because of the narrow flange 20 and as a result the temperature of the outer periphery 16 is lower than the bulk of the stage assembly 12. It is submitted that the reduction of the periphery temperature prevent the thermal decomposition of methane and hence the formation of carbon impurities.

The presence of the slotted groove 18 and the bevelled edge 24 provides uniformity by increasing the concentration of $CH_3^+$ ions in the plasma region and reducing the ratio of un-reacted methane in the plasma region. The substrate stage 10 also provides the stability to the plasma by intensifying the electric field of the microwave radiation in the region.

Last but not least, the substrate stage 10 ensures the heat current flows in such a way so that the temperature of the periphery of the stage is much lower than the rest of the pedestal.

It is an objective of the present invention to produce inclusion-free diamond, preferably gem grade diamond, by using the substrate stage 10 such that the thermal decomposition of the methane gas is prevented in the region where the diamond seeds are located.

In a first embodiment of the invention, methane, hydrogen, nitrogen and diborane containing gases are used as precursors for microwave plasma chemical vapour deposition process. The dominant concentration of the gases in the chamber is methane and hydrogen. Preferably, the flow of hydrogen gas is 800 sccm (standard cubic centimeters per minute) and methane gas is 55 sccm. The plasma of these gases is generated in the region 14 above the substrate stage 10. As the electric field will be intense at the sharp edges, the plasma is more stable and uniform in the described configuration of the substrate stage 10.

Figure 5:
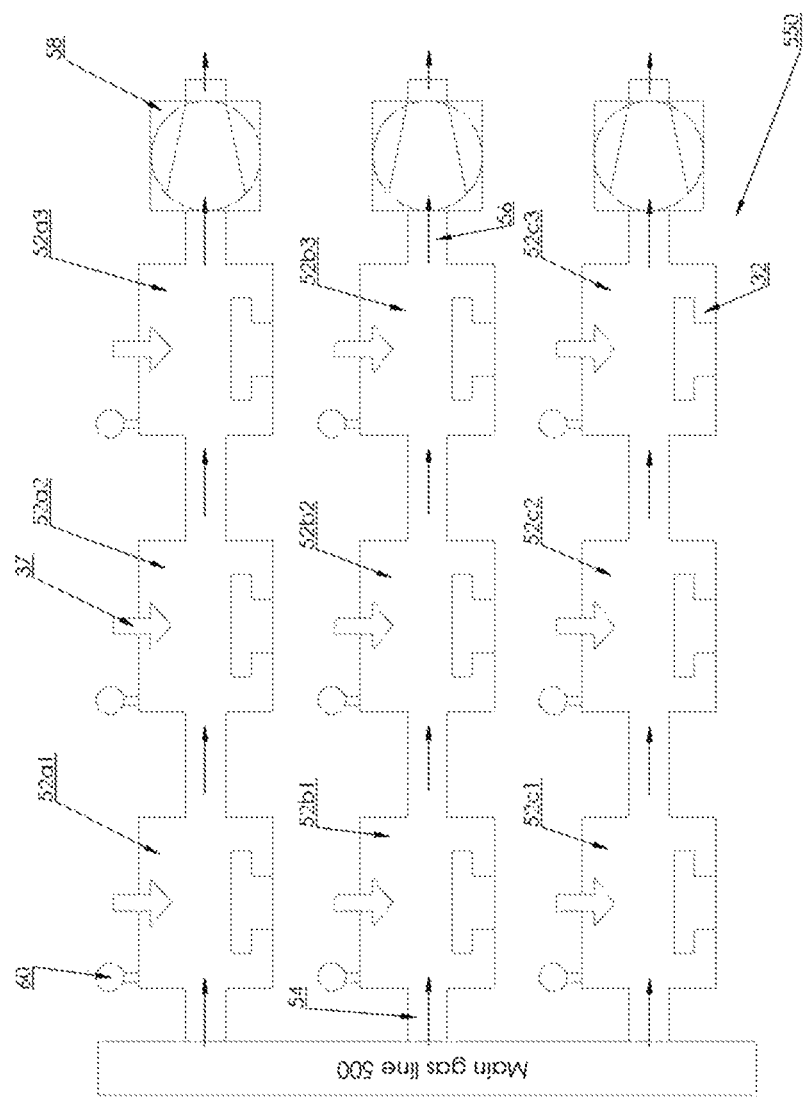
FIG. 5 shows a schematic view of an apparatus for growing gem grade diamonds according to the second embodiment of the invention.

FIG. 5 shows a schematic view of an apparatus for the manufacture of gem grade diamonds according to the second embodiment of the invention, where a plurality of chambers are interconnected by gas flow pipes to form a network. Some of the component of the diamond manufacture apparatus 550 is substantially the same as those of the diamond manufacture apparatus 50 and thus the description above with regard to FIG. 1 will suffice to describe those component likewise numbered in FIG. 5. For instance, gas entry 54, gas flow pipes 56, microwave arrangement 37, substrate stage assembly 32, pressure measuring apparatus 60, and vacuum pump 58 are substantially the same as those described in FIG. 1.

As shown in FIG. 5, chambers 52a1, 52a2, 52a3 and a vacuum pump 58 are arranged in series with gas flow pipes 56 in between so as to form a first branch in a chamber network. Chambers 52b1, 52b2, 52b3 and chambers 52c1, 52c2, 52c3 are arranged in a similar manner to form a second branch and a third branch respectively. The first branch, the second branch and the third branch are running in parallel with each other. Furthermore, gases are supplied to each branch from a main gas line 500 through each gas entry 54. The main gas line 500, the first branch, the second branch, and the third branch together form the chamber network, in which the gases flow.

Figure 6:
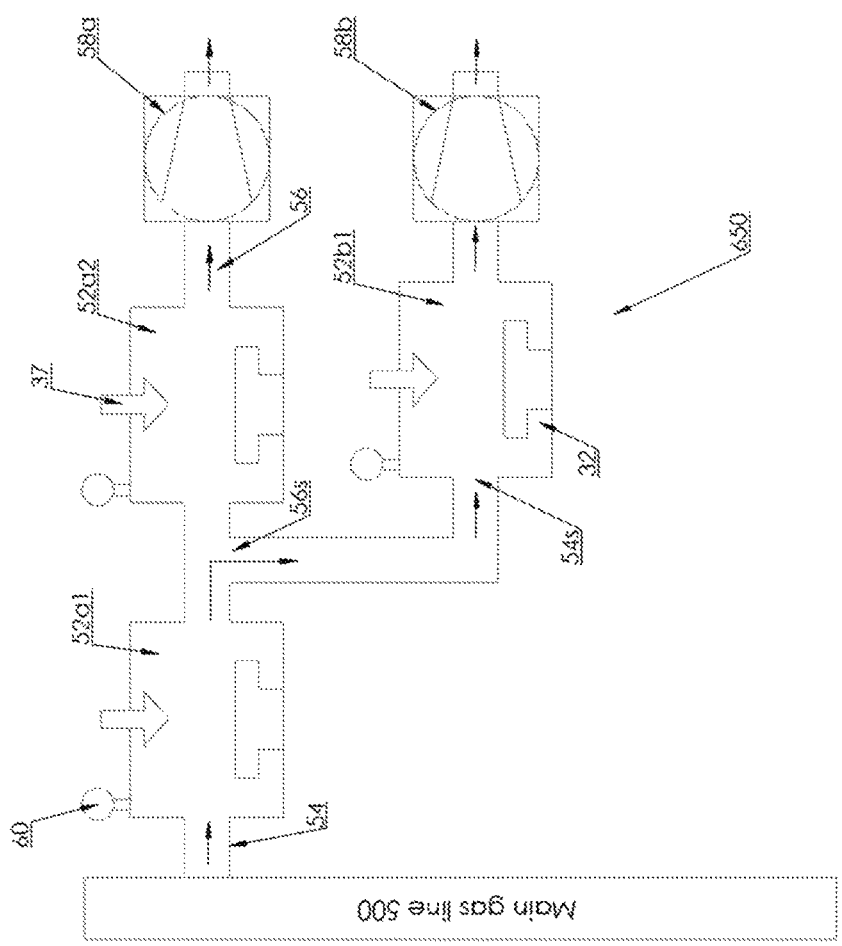
FIG. 6 shows a schematic view of an apparatus for growing gem grade diamonds according to the third embodiment of the invention.

FIG. 6 shows a schematic view of an apparatus for the manufacture of gem grade diamonds according to the third embodiment of the invention, where a plurality of chambers are interconnected by gas flow pipes to form another network. Some of the component of the diamond manufacture apparatus 650 is substantially the same as those of the diamond manufacture apparatus 50 and 550 and thus the description above with regard to FIG. 1 and FIG. 5 will suffice to describe those component likewise numbered in FIG. 6. For instance, gas entry 54, gas flow pipes 56, microwave arrangement 37, substrate stage assembly 32, pressure measuring apparatus 60, and vacuum pump 58 are substantially the same as those described in FIG. 1. In another embodiment, the main gas line 500 is substantially the same as that described in FIG. 5.

As shown in FIG. 6, chambers 52a1, 52a2, and a vacuum pump 58a are arranged in series and connected by gas flow pipes 56 so as to allow gas flow between chambers. Thus, chambers 52a1, 52a2, and the vacuum pump 58a form a first branch in a chamber network. A vacuum pump 58b is coupled to a chamber 52b1 in series so that the both of them together form a second branch in the chamber network. A gas flow pipe 56s in the first branch is coupled to a gas entry 54s of a chamber 52b1 in the second branch so as to allow gas flow between branches. The main gas line 500, the first branch and the second branch together form the chamber network, among which the gases flow. It should be understood that a chamber network may comprise any number of branches and a branch may comprise any number of chambers and the number of branches in a network and the number of chambers in a branch depend upon the capacities of the vacuum pump system and gas supply system.

Additionally, it is submitted that, although a relatively small amount of nitrogen is required, there must be at least some nitrogen gas in combination with diborane gas to be present in the gases supplied during the CVD process to increase the growth rate of the diamonds deposited by a CVD process. In addition, by using very small quantities of nitrogen and in combination with the diborane, the colour and the clarity of the diamond crystals can be remarkably improved. It is submitted that the presence of boron in the diamond structure containing nitrogen atoms will turn a yellow brown colour diamond colourless making it a gem grade diamond.

A method of growing mono-crystalline diamond using a substrate stage in accordance with a first embodiment of the invention involving a CVD process that utilises microwave plasma is as follows.

Diamond is grown on a diamond seed 19 that may vary in size between 1 mm×1 mm and 10 mm×10 mm and having a thickness ranging from 1 mm to 3 mm. The method is carried out in a microwave plasma chamber.

The crystallographic orientation of the diamond seeds 19 is determined and the diamond seeds 19 having an orientation other than {100} are rejected. The diamond seeds 19 having an orientation of {100} are polished to optical finish with roughness in the order of the wavelength of visible light in preparation for the CVD process.

Once the diamond seeds 19 are disposed inside the chamber 52, the temperature inside the chamber 52 is increased from ambient temperature to a temperature in the range of 750° C. to 1200° C. and the pressure inside the chamber is reduced to a pressure in the range of 120 mbar to 160 mbar.

The chamber is supplied with suitable gases for growing diamond and the gases comprise methane ($CH_4$), hydrogen ($H_2$), nitrogen ($N_2$) in combination with diborane ($B_2H_6$), and helium (He) and these gases are passed through each of the chambers at a gas flow rate of 30 l/hr.

Nitrogen gas in combination with the diborane gas are supplied in a quantity that comprises 0.0001 to 0.1 vol % of the balanced gases for growing diamond. For the optimal mixture of the nitrogen and diborane, the growth rate of the diamond is about 18-20 microns per hour.

An electrical field is applied to surround the seeds such that plasma is generated from the gases in the chamber 52. The electrical field is generated by a magnetron operating at 6000 Watt and at 2.45 GHz. The generated electrical field causes the hydrogen gas to be ionised, thereby forming plasma in the vicinity of the diamond seeds 19. Under these process conditions, diamond is caused to grow on the diamond seeds 19.

The growth pattern of diamond is step-wise and thereby enables diamond to grow that is substantially defect and impurity free.

It is apparent to a person skilled in the art that many modifications, alternatives and variations may be made to the preferred embodiment of the present invention as described above without departing from the spirit and scope of the present invention. Accordingly, it is intended to embrace all such modifications, alternatives and variations that fall within the scope of the included claims.

What is claimed is:

1. An apparatus for growing diamonds, the apparatus comprising:
   two or more chambers, each chamber in fluid connection with at least one other chamber, wherein each chamber includes at least one substrate stage assembly;
   a process gas operable to flow through the chambers such that purity of the process gas improves as the process gas flows successively through the chambers;
   a microwave arrangement for directing microwave energy to each substrate stage to convert the process gas above each substrate stage into a plasma; and
   wherein each of the at least one substrate stage assembly includes:
   a substrate stage made of a metal having a high thermal conductivity and including a substantially circular planar base with a peripheral raised edge to the circular base, wherein the peripheral raised edge defines a central recessed substrate receiving surface for receiving diamond seeds, the central recessed substrate receiving surface is substantially planar, and a surface around the central recessed substrate receiving surface comprises a bevel that has an inner sharp edge and an outer sharp edge, and the inner and outer sharp edges disposed to intensify an electric field component of the plasma, thereby causing the plasma to be stable and uniform; and
   wherein each of the substrate stage assemblies comprises a metal plate, the substrate stage, and a peripheral reflector, wherein the substrate stage and the peripheral reflector are both directly supported on top surface of the metal plate,
   wherein the cylindrical metallic reflector is spaced laterally outward from the peripheral raised edge of the substrate stage, wherein the cylindrical metallic reflector functions as a heat shield.

2. The apparatus as claimed in claim 1, wherein the chambers are arranged in a series, with a gas flow pipe connecting two adjacent chambers.

3. The apparatus as claimed in claim 1, wherein the two or more chambers are arranged in a parallel branched network, with a gas flow pipe connecting two adjacent chambers in each branched network.

4. The apparatus as claimed in claim 1, wherein the chambers are arranged in a combination of series and parallel branched networks.

5. The apparatus as claimed in claim 1, wherein each chamber has a casing adapted for housing the substrate stage assembly therein.

6. The apparatus as claimed in claim 1, wherein the metal plate is made of a metal with high thermal conductivity.

7. The apparatus as claimed in claim 1, wherein the peripheral raised edge further comprises an annular groove located outside of the bevel, wherein the annular groove reduces a rate of heat transfer from an area inside the bevel.

8. The apparatus as claimed in claim 1, wherein the peripheral raised edge comprises an upper surface and a lower surface, at least one of which includes an annular groove, wherein the annular groove reduces a rate of heat transfer to an area outside of the annular groove.

9. The apparatus as claimed in claim 1, wherein the peripheral raised edge comprises an upper surface and a lower surface, both of which include an annular groove located between the bevel and an outer peripheral area, wherein the annular grooves reduce a rate of heat transfer to the outer peripheral area, thereby reducing formation of carbon soot or impurities.

10. The apparatus as claimed in claim 1, wherein the process gas comprises methane, hydrogen, nitrogen and diborane.

11. The apparatus as claimed in claim 1, further comprising a vacuum pump disposed after a final chamber to draw the process gas from a gas line into a first chamber and to draw the process gas successively through adjoining chambers.

12. The apparatus as claimed in claim 1, further comprising a gas sensor disposed in each chamber to monitor ratios of constituent gases in the process gas.

13. The apparatus as claimed in claim 1, further comprising a pressure sensor disposed in each chamber to monitor pressure of the process gas.

* * * * *